(12) United States Patent
Yoon et al.

(10) Patent No.: US 7,999,457 B2
(45) Date of Patent: Aug. 16, 2011

(54) ORGANIC LIGHT EMITTING DISPLAY DEVICE

(75) Inventors: Ji-Hwan Yoon, Suwon-si (KR);
Kwan-Hee Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 123 days.

(21) Appl. No.: 12/394,533

(22) Filed: Feb. 27, 2009

(65) Prior Publication Data

US 2009/0295282 A1 Dec. 3, 2009

(30) Foreign Application Priority Data

May 28, 2008 (KR) .................. 10-2008-0049673

(51) Int. Cl.
*H01L 51/50* (2006.01)
*H01L 51/52* (2006.01)

(52) U.S. Cl. .................. 313/503; 313/504; 313/506

(58) Field of Classification Search ........... 313/500–512
See application file for complete search history.

(56) References Cited

U.S. PATENT DOCUMENTS

| 7,166,959 | B2 * | 1/2007 | Suzuki et al. | 313/504 |
| 2003/0067266 | A1 * | 4/2003 | Kim et al. | 313/504 |
| 2005/0077816 | A1 * | 4/2005 | Yamada et al. | 313/503 |
| 2005/0088081 | A1 * | 4/2005 | Nishikawa et al. | 313/504 |
| 2005/0140288 | A1 * | 6/2005 | Suzuki | 313/506 |

FOREIGN PATENT DOCUMENTS

| JP | 2005-93398 | 4/2005 |
| JP | 2005-197010 | 7/2005 |
| JP | 2006-278258 A | 10/2006 |
| JP | 2007-26852 | 2/2007 |
| KR | 10-2005-0067057 | 6/2005 |
| KR | 10-2005-0067067 | 6/2005 |
| KR | 10-2007-0035432 | 3/2007 |

OTHER PUBLICATIONS

KIPO action dated Jun. 25, 2009, for priority Korean Patent Application No. 10-2008-0049673.
Korean Registration Determination Certificate, dated Nov. 28, 2009, for priority Korean application 10-2008-0049673, as well as JP 18-278258, previously filed in an IDS dated Aug. 11, 2009.
Japanese Office action dated Apr. 19, 2011, for corresponding Japanese Patent application 2009-076798, noting listed references in this IDS.

* cited by examiner

*Primary Examiner* — Mariceli Santiago
(74) *Attorney, Agent, or Firm* — Christie, Parker & Hale, LLP

(57) ABSTRACT

An organic light emitting display (OLED) device having an organic light emission unit, the organic light emitting unit including a first electrode layer on a substrate, a second electrode layer on the first electrode layer, and an organic layer between the first electrode layer and the second electrode layer, the OLED device including a first auxiliary electrode layer between the organic layer and the first electrode layer. The organic light emission unit is divided into first, second, and third pixel units. Each of the first, second, and third pixel units includes a second auxiliary electrode layer between the organic layer and the first auxiliary electrode layer. The second auxiliary electrode layers of the first, second and third pixel units are formed to have different thicknesses respectively, so that light beams emitted from the first, second and third pixel units can be provided with a resonance effect.

11 Claims, 4 Drawing Sheets

ORGANIC LIGHT EMITTING DISPLAY DEVICE

CROSS-REFERENCE TO RELATED PATENT APPLICATION

This application claims priority to and the benefit of Korean Patent Application No. 10-2008-0049673, filed on May 28, 2008, in the Korean Intellectual Property Office, the entire content of which is incorporated herein by reference.

BACKGROUND OF THE INVENTION

1. Field of the Invention

The present invention relates to an organic light emitting display (OLED) device.

2. Description of the Related Art

OLED devices are self-emissive display devices including an anode, a cathode, and an organic light emission layer disposed between the cathode and the anode. When a voltage is applied to an OLED device, electrons injected from the cathode and holes injected from the anode are recombined within the organic light emission layer, thereby generating light. OLED devices can be designed to be light and thin as compared with cathode ray tubes (CRTs) or liquid crystal displays (LCDs), and are receiving attention as next-generation display devices because of their wide viewing angle, fast response speed, low power consumption, etc.

In full-color OLED devices, pixels provide different luminous efficiencies according to the colors displayed by the pixels. In other words, a green light emitting material has higher luminous efficiency than a red light emitting material and a blue light emitting material. The red light emitting material has higher luminous efficiency than the blue light emitting material. Thus, a lot of effort has been devoted to obtaining maximal efficiency and maximal brightness of OLEDs by controlling the thicknesses of organic films.

However, fine metal masks are needed to form organic films having different thicknesses within pixels. This process is complicated, and defects such as stains or blind spots are often generated as a result, leading to a decrease in the yield of OLED devices manufactured using such a process.

SUMMARY OF THE INVENTION

An aspect of an embodiment of the present invention is directed toward an organic light emitting display (OLED) device having a resonance structure for improving productivity and production yield.

According to an embodiment of the present invention, there is provided an OLED device having an organic light emission unit, the organic light emitting unit including a first electrode layer formed on a substrate, a second electrode layer formed on the first electrode layer, and an organic layer formed between the first electrode layer and the second electrode layer, the OLED device including a first auxiliary electrode layer formed between the organic layer and the first electrode layer, wherein the organic light emission unit is divided into a first pixel unit, a second pixel unit, and a third pixel unit, each of at least two of the first, second, and third pixel units includes a second auxiliary electrode layer formed between the organic layer and the first auxiliary electrode layer, and the second auxiliary electrode layers of the at least two of the first, second, and third pixel units are formed to have different thicknesses respectively, so that light beams emitted from the first, second and third pixel units can be provided with a resonance effect.

Each of the second auxiliary electrode layers may be formed of a material having a higher etching rate than that of a material used to form its corresponding first auxiliary electrode layer.

The first auxiliary electrode layer may comprise ITO, and each of the second auxiliary electrode layers may comprise IZO or AZO.

The first pixel unit, the second pixel unit, and the third pixel unit may emit light of different colors respectively.

The first pixel unit may emit red light, the second pixel unit may emit green light, and the third pixel unit may emit blue light.

The thickness of the second auxiliary electrode layer of the second pixel unit may be less than the thickness of the second auxiliary electrode layer of the first pixel unit and greater than the thickness of the second auxiliary electrode layer of the third pixel unit.

In one embodiment, the third pixel unit does not have a second auxiliary electrode layer.

The first electrode layer may include reflective metal, and the second electrode layer may comprise semi-transparent metal.

The first electrode layer may include semi-transparent metal, and the second electrode layer may comprise reflective metal.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
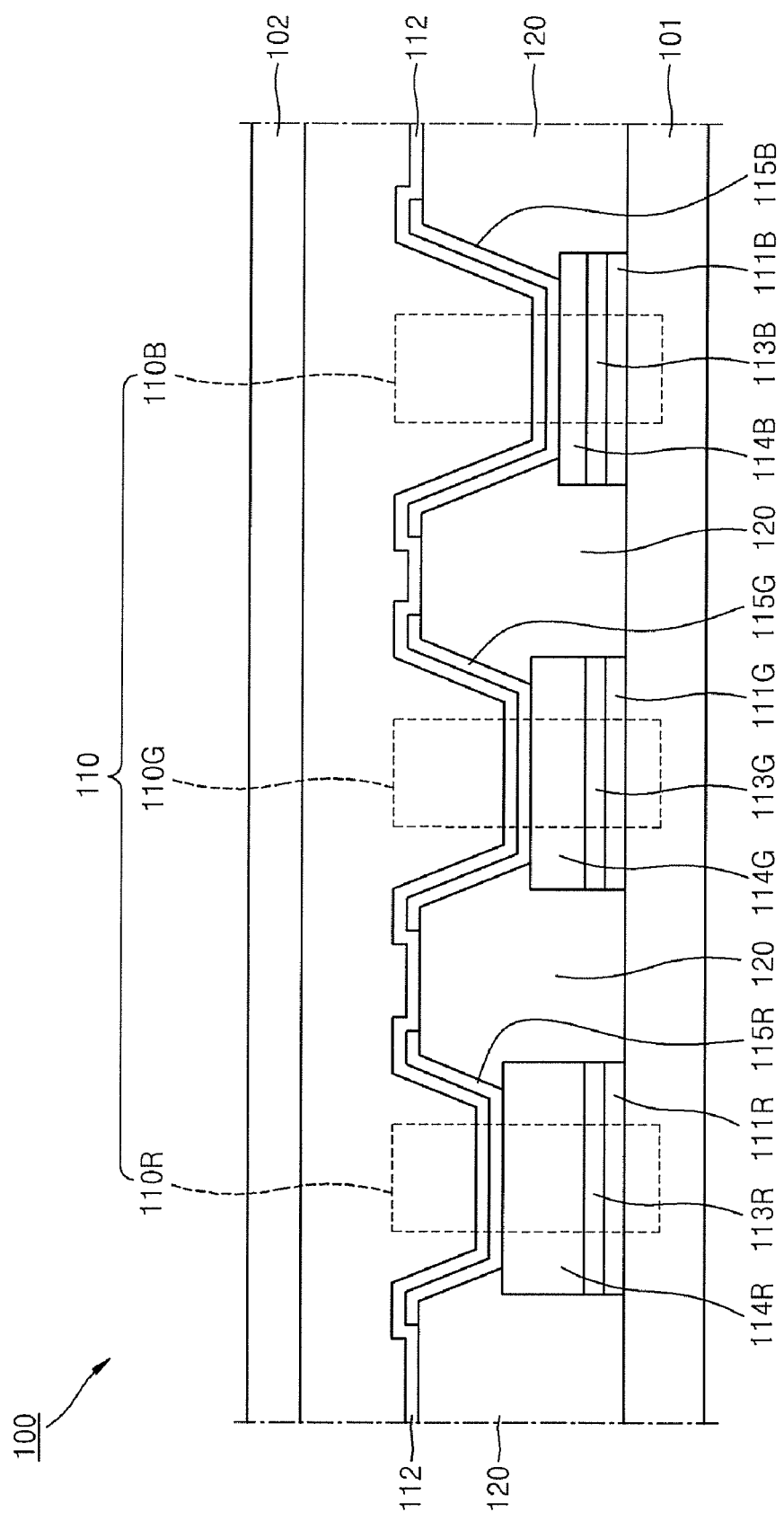
FIG. 1 is a schematic cross-sectional view of a top emission organic light emitting display (OLED) device according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 2:
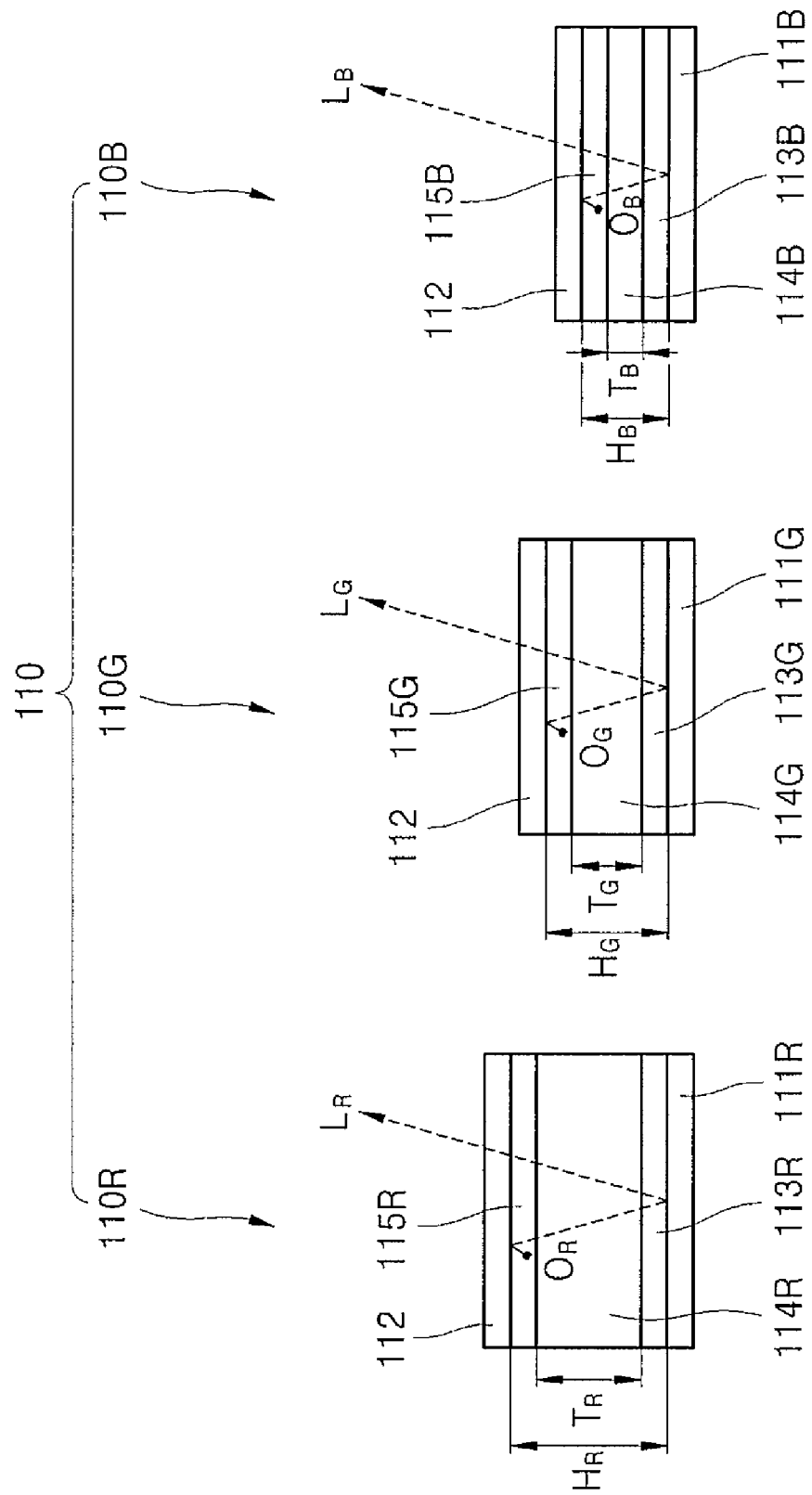
FIG. 2 is a schematic cross-sectional view of an organic light emission unit of the top emission OLED device illustrated in FIG. 1, according to an embodiment of the present invention.

FIG. 1 is a schematic cross-sectional view of a top emission organic light emitting display (OLED) device 100 according to an embodiment of the present invention. FIG. 2 is a schematic cross-sectional view illustrating an organic light emission unit 110, including first, second, and third pixel units 110R, 110G, and 110B, of the top emission OLED device 100, according to an embodiment of the present invention.

Figure 3:
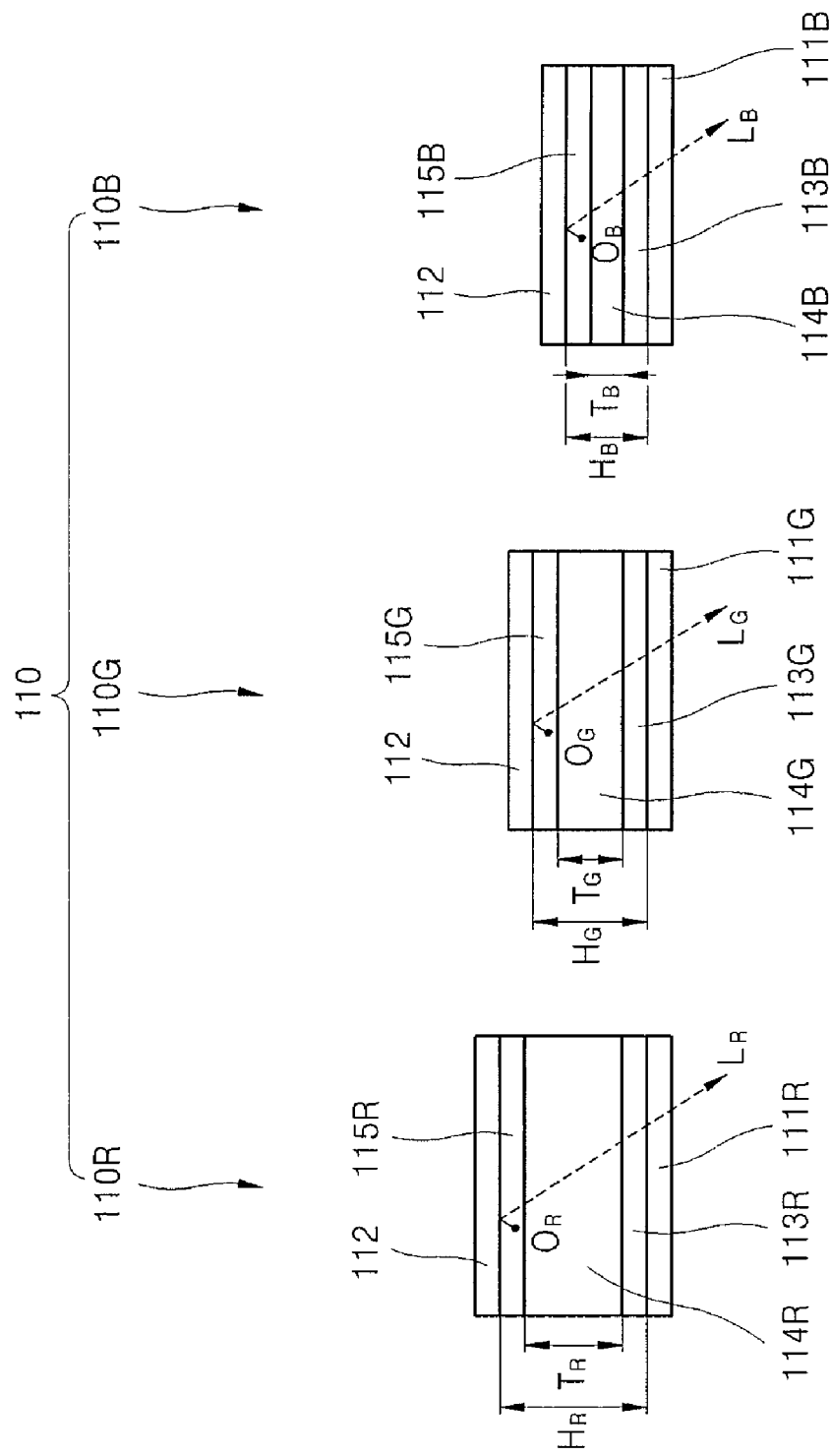
FIG. 3 is a schematic cross-sectional view of an organic light emission unit of a bottom emission OLED device according to another embodiment of the present invention.

FIG. 3 is a schematic cross-sectional view illustrating an organic light emission unit 110, including first, second, and third pixel units 110R, 110G, and 110B, of a bottom emission OLED device 100 according to another embodiment of the present invention.

Referring to FIGS. 1 through 3, each of the top emission and bottom emission OLED devices 100 may include a substrate 101, a sealing member 102, and an organic light emission unit 110.

The substrate 101 may be formed of a material such as transparent glass, a plastic sheet, or silicon, and have flexible or inflexible characteristics and transparent or opaque characteristics. However, the present invention is not limited to these listed materials, and a metal plate may be used as the substrate 101. In one embodiment, when each of the top emission and bottom emission OLED devices 100 of FIGS. 1 and 3 is an active matrix OLED (AM OLED) device, the substrate 101 further includes a thin-film transistor (TFT).

The sealing member 102 may be disposed above the organic light emission unit 110 and cohered to (or joined together with) the substrate 101. As illustrated in FIG. 1, the sealing member 102 may be separated from the organic light emission unit 110 and be bonded with the substrate 101 by a bonding member. The sealing member 102 may be a glass substrate or a plastic substrate such as an acryl substrate. In the top emission OLED device 100, the sealing member 102 may be formed of an electrically insulative material having high transmissivity with respect to light generated by the organic light emission unit 110. Examples of the electric insulative material include alkali glass, transparent glass (e.g., non-alkali gas), transparent ceramics (e.g., poly ethylene terephthalate (PET), polycarbonate, polyether sulfone, polyvinyl fluoride (PVF), poly acrylate, or zirconia), quartz, etc.

The organic light emission unit 110 may be formed on the substrate 101. The organic light emission unit 110 may include a plurality of pixel units, namely, the first, second, and third pixel units 110R, 110G, and 110B. The first pixel unit 110R, the second pixel unit 110G, and the third pixel unit 110B may emit different colors of light. More specifically, the first pixel unit 110R may emit red light LR, the second pixel unit 110G may emit green light LG, and the third pixel unit 110B may emit blue light LB.

The first, second, and third pixel units 110R, 110G, and 110B may be formed by sequentially stacking first electrode layers 111R, 111G, and 111B, respectively, first auxiliary electrode layers 113R, 113G, and 113B, respectively, second auxiliary electrode layers 114R, 114G, and 114B, respectively, organic layers 115R, 115G, and 115B, respectively, and a second electrode layer 112.

The first electrode layers 111R, 111G, and 111B are arranged on the substrate 101 so as to correspond to the first, second, and third pixel units 110R, 110G, and 110B, respectively. The second electrode layer 112 is disposed above the first electrode layers 111R, 111G, and 111B. The organic layers 115R, 115G, and 115B, the second auxiliary electrode layers 114R, 114G, and 114B, and the first auxiliary electrode layers 113R, 113G, and 113B all exist between the second electrode layer 112 and the first electrode layers 111R, 111G, and 111B.

The first electrode layers 111R, 111G, and 111B and the second electrode layer 112 apply a voltage between the first electrode layers 111R, 111G, and 111B and the second electrode layer 112. The first electrode layers 111R, 111G, and 111B and the second electrode layer 112 reflect or transmit light generated by the organic layers 115R, 115G, and 115B.

To be more specific, in the organic light emission unit 110 of the top emission OLED device 100 illustrated in FIG. 2, the first electrode layers 111R, 111G, and 111B may reflect the red light LR, the green light LG, and the blue light LB, respectively, emitted by the organic layers 115R, 115G, and 115B, and the second electrode layer 112 may transmit the red light LR, the green light LG, and the blue light LB emitted by the organic layers 115R, 115G, and 115B. In this case, the first electrode layers 111R, 111G, and 111B may be formed of reflective metal such as silver, aluminum, gold, platinum, chrome, or an alloy containing these metals, and the second electrode layer 112 may be formed of a semi-transparent metal. The semi-transparent metal may be an alloy of magnesium (Mg) and silver (Ag). Alternatively, the semi-transparent metal may be a metal such as silver, aluminum, gold, platinum, or chrome, or an alloy containing these metals. When the second electrode layer 112 is formed of the semi-transparent metal, the second electrode layer 112 may be formed to have a thickness that allows for a reflectance of 5% or more, and a transmittance of 50%.

On the other hand, in the organic light emission unit 110 of the bottom emission OLED device illustrated in FIG. 3, a second electrode layer 112 may reflect red light LR, green light LG, and blue light LB emitted by organic layers 115R, 115G, and 115B, and the first electrode layers 111R, 111G, and 111B may transmit the red light LR, the green light LG, and the blue light LB, respectively, emitted by the organic layers 115R, 115G, and 115B. In this case, the first electrode layers 111R, 111G, and 111B may be formed of a semi-transparent metal. The semi-transparent metal may be an alloy of Mg and Ag. Alternatively, the semi-transparent metal may be a metal such as silver, aluminum, gold, platinum, or chrome, or an alloy containing these metals. When the first electrode layers 111R, 111G, and 111B are formed of the semi-transparent metal, the first electrode layers 111R, 111G, and 111B may be formed to have a thickness that allows for a reflectance of 5% or more, and a transmittance of 50%. The second electrode layer 112 may be formed of reflective metal such as silver, aluminum, gold, platinum, chrome, or an alloy containing these metals.

The red light LR, the green light LG, and the blue light LB emitted by the organic layers 115R, 115G, and 115B are reflected and propagated in spaces between the first electrode layers 111R, 111G, and 111B and the second electrode layer 112. Resonance occurs in the red light LR, the green light LG, and the blue light LB according to distances HR, HG, and HB between the first electrode layer 111R and the second electrode layer 112, between the first electrode layer 111G and the second electrode layer 112, and between the first electrode layer 111B and the second electrode layer 112, respectively. Such resonance will now be described in greater detail.

In each of the organic light emission units 110 illustrated in FIGS. 2 and 3, first auxiliary electrode layers 113R, 113G, and 113B and second auxiliary electrode layers 114R, 114G, and 114B may be stacked on the first electrode layers 111R, 111G, and 111B, respectively. The first auxiliary electrode layers 113R, 113G, and 113B may be formed to have identical (or substantially identical) thicknesses on the first electrode layers 111R, 111G, and 111B, respectively. The first auxiliary electrode layers 113R, 113G, and 113B may be formed of transparent metal. For example, the first auxiliary electrode layers 113R, 113G, and 113B may be formed of a transparent metal compound such as ITO.

Figure 4:
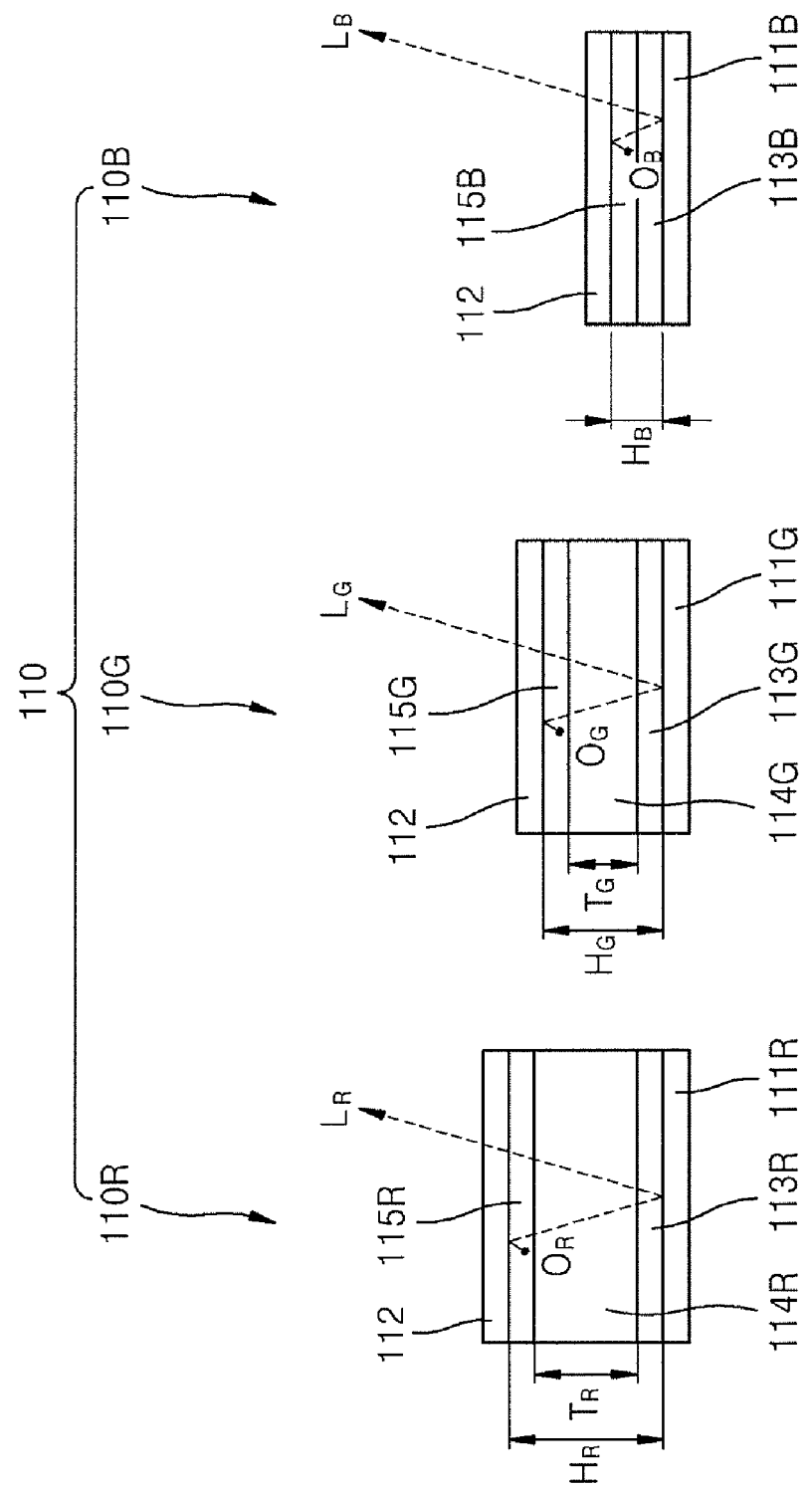
FIG. 4 is a schematic cross-sectional view of an organic light emission unit of an OLED device according to another embodiment of the present invention.

The second auxiliary electrode layers 114R, 114G, and 114B are formed on the first auxiliary electrode layers 113R, 113G, and 113B, respectively. The second auxiliary electrode layers 114R, 114G, and 114B of the first, second, and third pixel units 110R, 110G, and 110B are formed to have different thicknesses, respectively. In particular, when the first pixel unit 110R emits the red light LR, the second pixel unit 110G emits the green light LG, and the third pixel unit 110B emits the blue light LB, a thickness TG of the second auxiliary electrode layer 114G of the second pixel unit 110G may be less than a thickness TR of the second auxiliary electrode layer 114R of the first pixel unit 110R and greater than a thickness TB of the second auxiliary electrode layer 114B of the third pixel unit 110B. In another embodiment as shown in FIG. 4, the third pixel unit 110B may not even include the second auxiliary electrode layer 114B by entirely etching out the second auxiliary electrode layer 114B.

The second auxiliary electrode layers 114R, 114G, and 114B may be formed of a transparent metal having a higher etching rate than a transparent metal used to form the first auxiliary electrode layers 113R, 113G, and 113B. In one embodiment, the second auxiliary electrode layers 114R, 114G, and 114B may be formed of a material having an etching rate at least 10 times greater than that of the first auxiliary electrode layers 113R, 113G, and 113B. Since AZO or IZO is a metal compound having an etching rate of at least 10 times greater than ITO, if the first auxiliary electrode layers 113R, 113G, and 113B are formed of ITO, the second auxiliary electrode layers 114R, 114G, and 114B may be formed of AZO or IZO.

The second auxiliary electrode layers 114R, 114G, and 114B may have different thicknesses TR, TG, and TB by using a photolithographic technique. In other words, the second auxiliary electrode layers 114R, 114G, and 114B may be formed to have different thicknesses TR, TG, and TB by repeating the operations of coating a transparent metal for forming the second auxiliary electrode layers 114R, 114G, and 114B, on a substrate on which the first electrode layers 111R, 111G, and 111B and the first auxiliary electrode layers 113R, 113G, and 113B have been formed, coating a resist film on the resultant structure, exposing the resultant structure to light, and etching the resultant structure. Since the second auxiliary electrode layers 114R, 114G, and 114B have a much higher etching rate than the first auxiliary electrode layers 113R, 113G, and 113B, the first auxiliary electrode layers 113R, 113G, and 113B are less etched than the second auxiliary electrode layers 114R, 114G, and 114B. Thus, damage to the first auxiliary electrode layers 113R, 113G, and 113B is minimized (or reduced), and the second auxiliary electrode layers 114R, 114G, and 114B can be formed to have different thicknesses, respectively.

As described above, in an embodiment of the present invention, an OLED device having a resonance structure can be obtained by forming the second auxiliary electrode layers 114R, 114G, and 114B to have different thicknesses, respectively. In order for the OLED device to have a resonance structure, distances, namely, optical distances, between the first electrode layers 111R, 111G, and 111B and the second electrode layer 112 may be made different according to the wavelengths of light beams emitted by the first, second, and third pixel units 110R, 110G, and 110B. In the conventional art, the organic layers 115R, 115G, and 115B are formed to have different thicknesses respectively, in order for the OLED device to have a resonance structure. In order to form the organic layers 115R, 115G, and 115B to have different thicknesses respectively, in the conventional art, the organic layers 115R, 115G, and 115B are patterned by repeatedly using a fine metal mask. However, the patterning process using a fine metal mask is complicated, and causes defects such as stains or blind dots. On the other hand, in the embodiment of the present invention, the first auxiliary electrode layers 113R, 113G, and 113B and the second auxiliary electrode layers 114R, 114G, and 114B having different etch selectivities therebetween are formed to obtain an OLED device having a resonance structure. Thus, the use of a fine metal mask to form the organic layers 115R, 115G, and 115B having different thicknesses can be minimized (or reduced). This leads to an increase in the yield of OLED devices manufactured using such a process and a reduction of the length of the manufacturing process.

The organic layers 115R, 115G, and 115B are formed on the second auxiliary electrode layers 114R, 114G, and 114B, respectively. The organic layers 115R, 115G, and 115B may be formed of a small molecular organic material and/or a polymer organic material. Each of the organic layers 115R, 115G, and 115B may be formed by stacking a hole injection layer (HIL), a hole transport layer (HTL), an emission layer (EML), an electron transport layer (ETL), and an electron injection layer (EIL), and each of the layers may have a single or multi-layered structure. The HIL may be formed of a material such as copper phthalocyanine (CuPc), N,N'-Di (naphthalene-1-yl)-N,N'-diphenyl-benzidine (NPB), or tris-8-hydroxyquinoline aluminum. The HTL may be formed of PEDOT. The ETL may be formed of polycyclic hydrocarbon-series derivatives, a heterocyclic compound, or tris(8-quinolato)aluminum. The EIL may be formed of a material such as LiF, Liq, NaF, or Naq.

When the first pixel unit 110R, the second pixel unit 110G, and the third pixel unit 110B emit the red light LR, the green light LG, and the blue light LB, respectively, the EML of the first pixel unit 110R may be formed of a phosphor including a host material, such as carbazole biphenyl (CBP) or mCP, and a dopant material such as at least one of PlQIr (acac)(bis (1-phenylisoquinoline)acetylacetonate iridium), PQIr(acac (bis(1-phenylquinoline)acetylacetonate iridium), PQIr(tris (1-phenylquinoline)iridium), and PtPEP(octaethylporphyrin platinum). Alternatively, the EML of the first pixel unit 110R may be formed of a fluorescent material such as PED:Eu (DBM)3(Phen) or perylene.

The EML of the second pixel unit 110G may be formed of a phosphor material including a host such as CBP or mCP and a dopant such as Ir(ppy)3 (fac tris(2-phenylpyridine)iridium). Alternatively, the EML of the second pixel unit 110G may be formed of a fluorescent material such as Alq3(tris(8-hydroxyquinoline)aluminum).

The EML of the third pixel unit 110B may be formed of a fluorescent material including DPVBi, spiro-DPVBi, spiro-6P, distyrylbenzene (DSB), distyrylarylene (DSA), PFO-series polymer, and/or PPV-series polymer. When the EML of the third pixel unit 110B is formed of a phosphor material, light characteristics are unstable. Thus, the EML of the third pixel unit 110B is formed of the fluorescent material.

These EMLs may be formed using a suitable method such as laser induced thermal imaging (LITI), inkjet printing, and/or vapor deposition.

An OLED device according to an embodiment of the present invention as described above forms a resonance structure by using first auxiliary electrode layers and second auxiliary electrode layers having different etch selectivities, thereby increasing the productivity and yield of the OLED device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display (OLED) device having an organic light emission unit, the organic light emitting unit comprising a first electrode layer on a substrate, a second electrode layer on the first electrode layer, and an organic layer between the first electrode layer and the second electrode layer, the OLED device comprising a transparent first auxiliary electrode layer between the organic layer and the first electrode layer, wherein:
   the organic light emission unit is divided into a first pixel unit, a second pixel unit, and a third pixel unit;
   each of at least two of the first, second, and third pixel units comprises a second auxiliary electrode layer between the organic layer and the first auxiliary electrode layer; and
   the second auxiliary electrode layers of the at least two of the first, second, and third pixel units respectively have different thicknesses, so that light beams emitted from the first, second and third pixel units can be provided with a resonance effect.

2. The OLED device of claim 1, wherein each of the second auxiliary electrode layers has a material characteristic with a higher etching rate than that of its corresponding first auxiliary electrode layer.

3. The OLED device of claim 1, wherein the first pixel unit, the second pixel unit, and the third pixel unit are configured to emit light of different colors respectively.

4. The OLED device of claim 3, wherein the first pixel unit is configured to emit red light, the second pixel unit is configured to emit green light, and the third pixel unit is configured to emit blue light.

5. The OLED device of claim 4, wherein the thickness of the second auxiliary electrode layer of the second pixel unit is less than the thickness of the second auxiliary electrode layer of the first pixel unit and greater than the thickness of the second auxiliary electrode layer of the third pixel unit.

6. The OLED device of claim 1, wherein the organic layer is divided into a first organic layer for the first pixel unit, a second organic layer for the second pixel unit, and a third organic layer for the third pixel unit.

7. The OLED device of claim 6, wherein the first, second, and third organic layers have substantially identical thicknesses.

8. An organic light emitting display (OLED) device having an organic light emission unit, the organic light emitting unit comprising a first electrode layer on a substrate, a second electrode layer on the first electrode layer, and an organic layer between the first electrode layer and the second electrode layer, the OLED device comprising a first auxiliary electrode layer between the organic layer and the first electrode layer, wherein
   the organic light emission unit is divided into a first pixel unit, a second pixel unit, and a third pixel unit,
   each of at least two of the first, second, and third pixel units comprises a second auxiliary electrode layer between the organic layer and the first auxiliary electrode layer,
   the second auxiliary electrode layers of the at least two of the first, second, and third pixel units respectively have different thicknesses, so that light beams emitted from the first, second and third pixel units can be provided with a resonance effect,
   each of the second auxiliary electrode layers has a material characteristic with a higher etching rate than that of its corresponding first auxiliary electrode layer,
   the first auxiliary electrode layer comprises ITO, and
   each of the second auxiliary electrode layers comprises at least one of IZO or AZO.

9. An organic light emitting display (OLED) device having an organic light emission unit, the organic light emitting unit comprising a first electrode layer on a substrate, a second electrode layer on the first electrode layer, and an organic layer between the first electrode layer and the second electrode layer, the OLED device comprising a first auxiliary electrode layer between the organic layer and the first electrode layer, wherein
   the organic light emission unit is divided into a first pixel unit, a second pixel unit, and a third pixel unit,
   each of at least two of the first, second, and third pixel units comprises a second auxiliary electrode layer between the organic layer and the first auxiliary electrode layer,
   the second auxiliary electrode layers of the at least two of the first, second, and third pixel units respectively have different thicknesses, so that light beams emitted from the first, second and third pixel units can be provided with a resonance effect,
   the first electrode layer comprises reflective metal, and
   the second electrode layer comprises semi-transparent metal.

10. An organic light emitting display (OLED) device having an organic light emission unit, the organic light emitting unit comprising a first electrode layer on a substrate, a second electrode layer on the first electrode layer, and an organic layer between the first electrode layer and the second electrode layer, the OLED device comprising a first auxiliary electrode layer between the organic layer and the first electrode layer, wherein
   the organic light emission unit is divided into a first pixel unit, a second pixel unit, and a third pixel unit,
   each of at least two of the first, second, and third pixel units comprises a second auxiliary electrode layer between the organic layer and the first auxiliary electrode layer,
   the second auxiliary electrode layers of the at least two of the first, second, and third pixel units respectively have different thicknesses, so that light beams emitted from the first, second and third pixel units can be provided with a resonance effect,
   the first electrode layer comprises semi-transparent metal, and
   the second electrode layer comprises reflective metal.

11. An organic light emitting display (OLED) device comprising:
   a first organic light emission unit;
   a second organic light emission unit; and
   a third organic light emission unit, each of the first, second, and third organic light emitting units comprising a first electrode layer on a substrate, a second electrode layer on the first electrode layer, an organic layer between the first electrode layer and the second electrode layer, and a transparent first auxiliary electrode layer between the organic layer and the first electrode layer, wherein:
   each of at least two of the first, second, and third organic light emission units comprises a second auxiliary electrode layer between the organic layer and the first auxiliary electrode layer; and
   the second auxiliary electrode layers of the at least two of the first, second, and third organic light emission units respectively have different thicknesses, so that light beams emitted from the first, second and third organic light emission units can be provided with a resonance effect.

* * * * *